US012753269B2

(12) United States Patent
Ki et al.

(10) Patent No.: US 12,753,269 B2
(45) Date of Patent: Oct. 6, 2026

(54) ADHESIVE MEMBER AND DISPLAY DEVICE INCLUDING THE SAME

(71) Applicant: SAMSUNG DISPLAY CO., LTD., Yongin-si (KR)

(72) Inventors: Boo Kan Ki, Yongin-si (KR); Kyung Mi Kwon, Hwaseong-si (KR); Won Seok Kim, Seoul (KR); Ho Yun Byun, Hwaseong-si (KR); Se Been Lee, Seoul (KR); Jeong In Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 283 days.

(21) Appl. No.: 17/453,674

(22) Filed: Nov. 5, 2021

(65) Prior Publication Data

US 2022/0336770 A1 Oct. 20, 2022

(30) Foreign Application Priority Data

Apr. 15, 2021 (KR) ........................ 10-2021-0049180

(51) Int. Cl.
*C08G 18/62* (2006.01)
*C08G 18/67* (2006.01)
(Continued)

(52) U.S. Cl.
CPC ..... *C08G 18/6229* (2013.01); *C08G 18/6755* (2013.01); *C08G 18/71* (2013.01);
(Continued)

(58) Field of Classification Search
CPC .... H10K 50/841; H10K 50/86; H10K 77/111; H10K 2102/311; H10K 50/8426;
(Continued)

(56) References Cited

U.S. PATENT DOCUMENTS 10,871,802 B2 12/2020 Yug
10,920,108 B2 2/2021 Suzuki
(Continued)

FOREIGN PATENT DOCUMENTS

CN 104955901 A 9/2015
CN 106715625 A 5/2017
(Continued)

OTHER PUBLICATIONS

Machine translation of JP 2014-221873 A (Year: 2014).*
(Continued)

*Primary Examiner* — Callie E Shosho
*Assistant Examiner* — Steven A Rice
(74) *Attorney, Agent, or Firm* — F. CHAU & ASSOCIATES, LLC

(57) ABSTRACT

A display device and an adhesive member are provided. A display device according to an embodiment of the present disclosure includes: a display panel; a cover window disposed on the display panel; and a first adhesive member disposed between the display panel and the cover window, in which the first adhesive member includes a urethane monomer, and the urethane monomer includes 2,6-diisopropylphenyl isocyanate (2,6-DIPPI) of about 5 wt % or more and about 10 wt % or less with respect to a total weight of the first adhesive member.

13 Claims, 10 Drawing Sheets

(51) Int. Cl.
*C08G 18/71* (2006.01)
*C09J 175/14* (2006.01)
*H10K 59/80* (2023.01)

(52) U.S. Cl.
CPC .......... *C09J 175/14* (2013.01); *H10K 59/871* (2023.02); *H10K 59/8722* (2023.02); *H10K 59/8791* (2023.02)

(58) Field of Classification Search
CPC .... H10K 71/00; C08G 18/6755; C08G 18/71; C08G 18/6229; C09J 175/14; C09J 175/04; C09J 4/00; C09J 11/06; C09J 175/12; C09J 2203/318; C09J 2301/312; C09J 2301/416; C09D 133/066; G09F 9/33
USPC ........................................................ 428/411.1
See application file for complete search history.

(56) References Cited

U.S. PATENT DOCUMENTS

| | | | | |
|---|---|---|---|---|
| 11,271,191 | B2 | 3/2022 | Lee et al. | |
| 2017/0218231 | A1* | 8/2017 | Suzuki | C09J 133/02 |
| 2020/0123422 | A1* | 4/2020 | Fukuda | H01B 1/02 |
| 2020/0301474 | A1* | 9/2020 | Yug | B32B 3/263 |
| 2021/0036257 | A1* | 2/2021 | Lee | F28F 21/02 |

FOREIGN PATENT DOCUMENTS

| | | | |
|---|---|---|---|
| CN | 111724677 | A | 9/2020 |
| CN | 112309251 | A | 2/2021 |
| JP | 2014221873 | A * | 11/2014 |
| JP | 2016-102182 | A | 6/2016 |
| KR | 10-2014-0147764 | | 12/2014 |
| KR | 10-2016-0053788 | | 5/2016 |
| KR | 10-2017-0039785 | | 4/2017 |
| KR | 10-2020-0052038 | | 5/2020 |

OTHER PUBLICATIONS

Rolph et al., "Blocked isocyanates: from analytical and experimental considerations to non-polyurethane applications", Nov. 8, 2016, Polymer Chemistry, vol. 7, Issue 48, p. 7357 (Year: 2016).*
Kim, et al., "Study on Crosslinking Properties of Acrylic Pressure-Sensitive Adhesives", Journal of Adhesion and Interface, vol. 14, No. 1, 2013, pp. 43-48.
CN Office Action dated Apr. 10, 2026 in related CN 202210185204.1, in Chinese (9 pages).

* cited by examiner

ADHESIVE MEMBER AND DISPLAY DEVICE INCLUDING THE SAME

CROSS-REFERENCE TO RELATED APPLICATION

This application claims priority under 35 U.S.C. 119 to Korean Patent Application No. 10-2021-0049180, filed on Apr. 15, 2021, in the Korean Intellectual Property Office, the contents of which are incorporated by reference herein in their entirety.

TECHNICAL FIELD

The present disclosure relates to an adhesive member and a display device including the same.

DISCUSSION OF RELATED ART

With the advancement of multimedia, display devices are of increasing importance in providing high quality images. In response to this trend, various types of display devices such as an organic light emitting display (OLED) and a liquid crystal display (LCD) have been used. These various types of display devices have been diversified in their applications to various mobile electronic devices, for example, portable electronic devices such as a smart phone, a smart watch, and a tablet PC.

The display device may include a display panel for generating screen images, a cover window covering the display panel, and an adhesive member adhering the cover window to the display panel.

After the display panel and the cover window are attached to each other through the adhesive member, bubbles may remain in the adhesive member, and as a permeation depth of the remaining bubbles becomes longer, design of the display device may be limited.

SUMMARY

An aspect of the present disclosure is to provide an adhesive member that may reduce occurrence of bubbles in a manufacturing process of a display device, and a display device including the adhesive member. For example, the present disclosure is to provide an adhesive member that may reduce occurrence of bubbles after an autoclave process performed by adhesion between a display panel and a cover window, and a display device including the adhesive member.

The aspects of the present disclosure are not limited to those mentioned above, and additional features of the present disclosure, which are not mentioned herein, will be clearly understood by those skilled in the art from the following description of the present disclosure.

According to an embodiment of the present disclosure, a display device includes: a display panel; a cover window disposed on the display panel; and a first adhesive member disposed between the display panel and the cover window, in which the first adhesive member includes a urethane monomer, and the urethane monomer includes 2,6-diisopropylphenyl isocyanate (2,6-DIPPI) of about 5 wt % or more and about 10 wt % or less with respect to a total weight of the first adhesive member.

According an embodiment of the present disclosure, a display device includes: a display panel; a cover window disposed on the display panel; and an adhesive member disposed between the display panel and the cover window, in which the adhesive member is manufactured as a cylindrical shaped sample having a diameter of 8 mm and a height of 600 μm and indicates a maximum strain of about 100% or less during a creep test carried out for the sample by a shearing stress of 2000 Pa at 60° C. for 600 seconds, and the adhesive member indicates a shearing stress of about 3000 Pa or more and about 4000 Pa or less during a stress relaxation test carried out for the cylindrical shaped sample with a strain of 25% at 60° C.

According to an embodiment of the present disclosure, an adhesive member includes an acrylic monomer; a urethane monomer; and a photoinitiator, in which the urethane monomer includes 2,6-diisopropylphenyl isocyanate (2,6-DIPPI) of about 5 wt % or more and about 10 wt % or less with respect to a total weight.

According an embodiment of the present disclosure, a display device includes: a display panel; a cover window disposed on the display panel; and an adhesive member disposed between the display panel and the cover window, in which the adhesive member includes: a urethane monomer; a photoinitiator; and an acrylic monomer. The acrylic monomer includes 2-ethylhexyl acrylate (2-EHA) of about 45 wt % or more and about 55 wt % or less; methyl methacrylate exceeding 0 wt % and including about 5 wt % or less; octyl methacrylate of about 10 wt % or more and about 20 wt % or less; and 2-hydroxyethyl acrylate (2-HEA) of about 20 wt % or more and about 30 wt % or less, with respect to a total weight of the adhesive member.

According to the adhesive member and the display device including the same according to an embodiment of the present disclosure, occurrence of bubbles may be reduced in a manufacturing process of the display device. For example, occurrence of bubbles may be reduced after an autoclave process performed by adhesion between a display panel and a cover window.

BRIEF DESCRIPTION OF THE DRAWINGS

The above and other aspects and features of the present disclosure will become more apparent by describing in detail exemplary embodiments thereof with reference to the accompanying drawings, in which.

Figure 1:
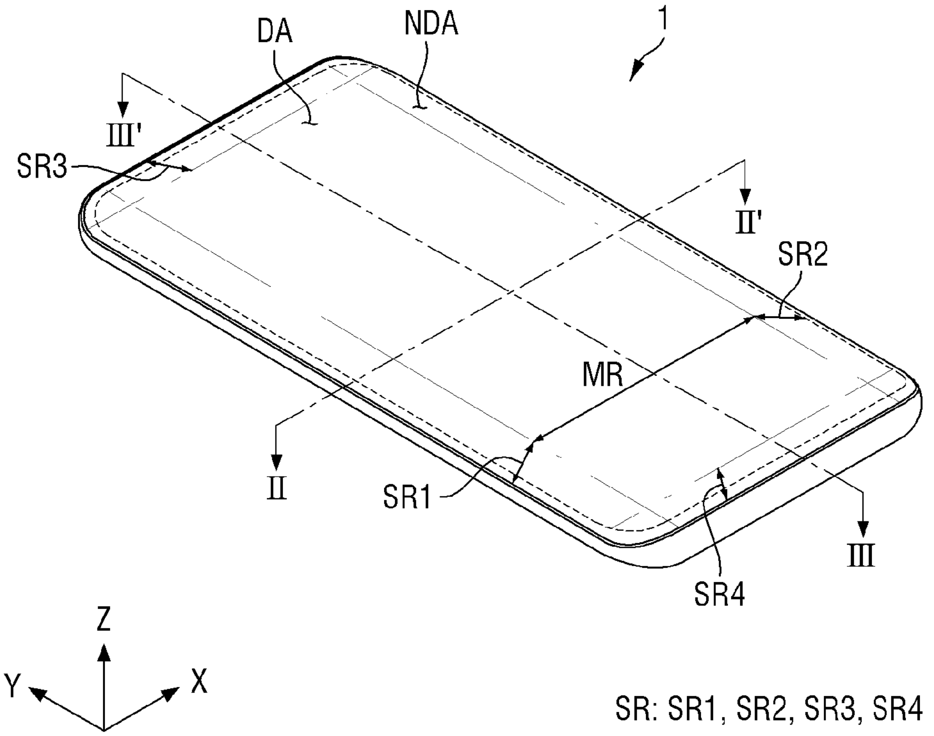
FIG. 1 is a perspective view illustrating a display device according to an embodiment of the present disclosure.

Since the drawings in FIGS. 1-8 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, detailed embodiments of the present disclosure will be described with reference to the accompanying drawings.

FIG. 1 is a perspective view illustrating a display device according to an embodiment of the present disclosure.

Referring to FIG. 1, a display device 1 may be provided in a rectangular shape on the plane. For example, the display device 1 may include short sides extending along a first direction X, and long sides extending along a second direction Y. Corners where the short sides extending along the first direction X meet the long sides extending along the second direction Y may be rounded to have a predetermined curvature or formed at a right angle. A plane shape of the display device 1 is not limited to the rectangular shape or other quadrangular shape, and may be formed in a circular shape, an elliptical shape, or another polygonal shape such as, for example, a triangular shape, a pentagonal shape or a hexagonal shape.

In an embodiment of the present disclosure, the first direction X and the second direction Y are respective directions different from each other and cross each other. In FIG. 1, the first direction X may refer to an extending direction of the short sides of the display device 1, and the second direction Y may refer to an extending direction of the long sides of the display device 1. Also, a third direction Z may refer to a direction crossing the first direction X and the second direction Y. In an embodiment of the present disclosure, the first direction X, the second direction Y and the third direction Z may be perpendicular to each other. However, it is to be understood that the directions mentioned in the embodiment refer to relative directions, and the embodiment is not limited to the mentioned directions.

The display device 1 may include a planarization portion MR including a flat surface and an edge portion SR extending from at least one side of the planarization portion MR. A plane shape of the planarization portion MR may be similar to that of the display device 1. For example, the planarization portion MR may include short sides extending along the first direction X, and long sides extending along the second direction Y. In the planarization portion MR, corners where the short sides extending along the first direction X meet the long sides extending along the second direction Y may be rounded to have a predetermined curvature or formed at a right angle. The plane shape of the planarization portion MR may be formed in a circular shape, an elliptical shape, or another polygonal shape such as, for example, a triangular, a pentagonal or a hexagonal shape, without being limited to a rectangular shape or other quadrangular shape.

In an embodiment of the present disclosure, a central region of the planarization portion MR is flat, and an edge region of the planarization portion MR surrounding the central region may be a curve having a predetermined curvature. However, the present disclosure is not limited thereto. For example, in an embodiment of the present disclosure, the planarization portion MR may fully be flat.

The edge portion SR according to an embodiment of the present disclosure may be provided in a plural number. For example, four edge portions SR may be provided. Assuming that the long side positioned at the other side of the first direction X is referred to as a first long side and the long side positioned at one side of the first direction X is referred to as a second long side in the long sides of the planarization portion MR, and the short side positioned at one side of the second direction Y is referred to as a first short side and the short side positioned at the other side of the second direction Y is referred to as a second short side in the short sides of the planarization portion MR. The edge portion SR may include a first edge portion SR1 extending from the first long side of the planarization portion MR, a second edge portion SR2 extending from the second long side of the planarization portion MR, a third edge portion SR3 extending from the first short side of the planarization portion MR, and a fourth edge portion SR4 extending from the second short side of the planarization portion MR.

The planarization portion MR may include a first long side and a second long side, which face each other along the first direction X, and may include a first short side and a second short side, which face each other along the second direction Y.

In an embodiment of the present disclosure, the planarization portion MR may generally be parallel with a plane defined by the first direction X and the second direction Y. The edge portion SR may be disposed to surround the planarization portion MR, and may be bent from the planarization portion MR toward a lower side of the display device 1. For example, the edge portion SR may be bent from the planarization portion MR to the other side of the third direction Z. In other words, the edge portion SR may be positioned on at least one side of the planarization portion MR, and may be bent from the planarization portion MR in a thickness direction (i.e., the third direction Z) of the display device 1. A portion of each edge portion SR may include a curve having a predetermined curvature, and the other portion may be flat. In detail, in the edge portion SR, a region adjacent to the planarization portion MR may be a curve having a predetermined curvature, and the other portion may be flat.

A level (or angle) of each edge portion SR bent from the planarization portion MR may be an obtuse angle, but may be a right angle or an acute angle without being limited to the obtuse angle.

In an embodiment of the present disclosure, each edge portion SR may include a curve having a predetermined curvature. The curvatures of the respective edge portions SR may be constant per region but may be different per region. Also, in an embodiment of the present disclosure, the edge portion SR may fully be flat.

The display device 1 may include a display area DA and a non-display area NDA in view of screen display. The display area DA may be an area on which a screen is displayed, and the non-display area NDA may be an area on which a screen is not displayed. For example, the display area DA may be an area in which pixels are arranged to display an image. The non-display area NDA may be an area that does not display an image because pixels are not arranged. In an embodiment of the present disclosure, each of the pixels may include a light emitting element, e.g., an organic light emitting diode. The display area DA may be positioned at the center of the display device 1, and the non-display area NDA may be positioned in the periphery of the display area DA. For example, the non-display area NDA may be positioned to surround the display area DA.

In an embodiment of the present disclosure, the planarization portion MR and a portion of each edge portion SR adjacent to the edge of the planarization portion MR may be positioned in the display area DA. The planarization portion MR may not be positioned in the non-display area NDA, and a portion of the edge portion SR may be positioned in the non-display area NDA. A portion of the edge portion SR positioned in the non-display area NDA may surround another portion of the edge portion SR positioned in the display area DA.

Figure 2:
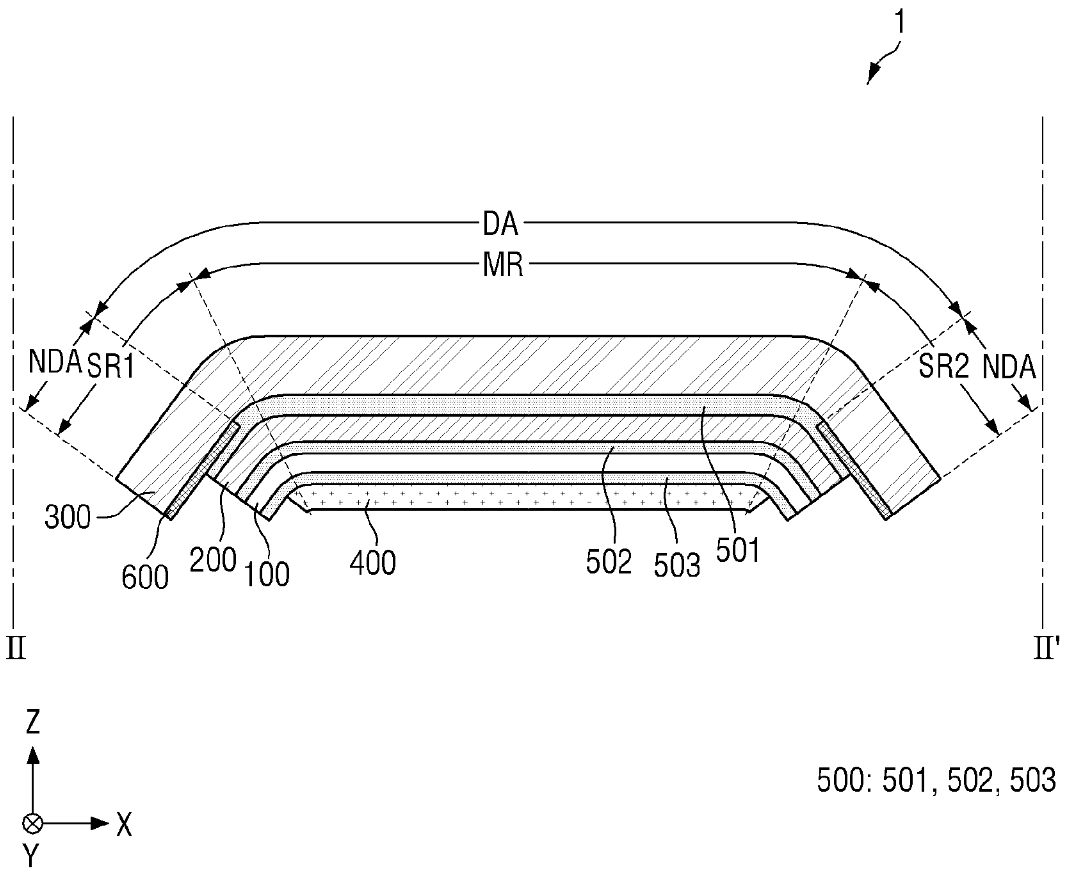
FIG. 2 is a cross-sectional view taken along line II-II' of FIG. 1.
Figure 3:
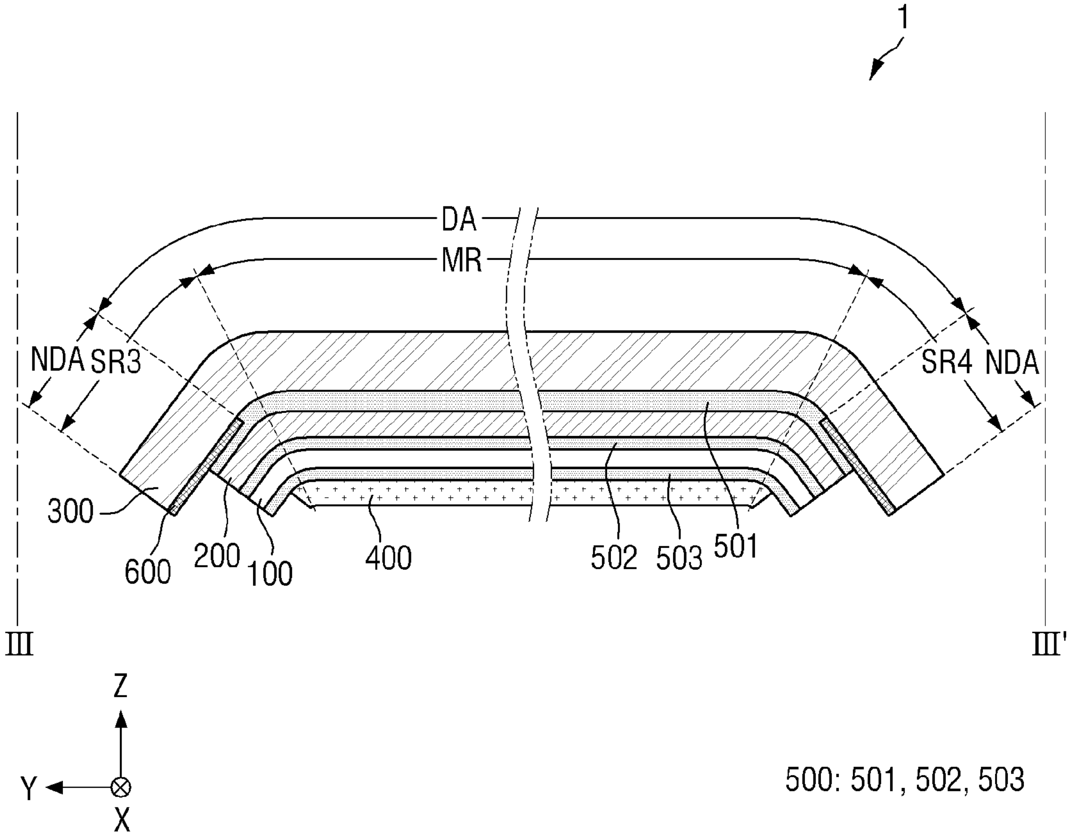
FIG. 3 is a cross-sectional view taken along line of III-III' FIG. 1.

FIG. 2 is a cross-sectional view taken along line II-II' of FIG. 1. FIG. 3 is a cross-sectional view taken along line III-III' of FIG. 1.

Referring to FIGS. 2 and 3, the display device 1 may include a display panel 100, a polarizing member 200 disposed on the display panel 100, a cover window 300 disposed on the polarizing member 200, and a lower cover panel 400 disposed below the display panel 100.

The display panel 100, the polarizing member 200, the cover window 300 and the lower cover panel 400 may be disposed over the planarization portion MR and the edge portion SR of the display device 1.

The display panel 100 may include an element and circuits for displaying an image, for example, a pixel circuit such as a switching element, and a self-light emitting element for emitting light by an operation of the pixel circuit. In an embodiment of the present disclosure, the self-light emitting element may include at least one of, for example, an organic light emitting diode, a quantum dot light emitting diode, an inorganic-based micro light emitting diode (for example, micro LED), or an inorganic-based light emitting diode (for example, nano LED) of which at least one of a width or a length has a nano size. In an embodiment of the present disclosure, the pixel circuit may include at least a driving thin-film transistor, a switching thin-film transistor, and a storage capacitor. The number of thin-film transistors and the number of storage capacitors may be changed in various ways according to a design of the pixel circuit. For example, the pixel circuit may include three or more thin-film transistors and/or two or more storage capacitors. The display panel 100 may include one surface oriented toward the polarizing member 200 and the cover window 300 and the other surface oriented toward the lower cover panel 400.

The polarizing member 200 may be disposed on the display panel 100. In detail, the polarizing member 200 may be disposed on one surface of the display panel 100. The polarizing member 200 may serve to reduce external light reflection, and may be attached onto the display panel 100 through a second adhesive member 502. For example, the polarizing member 200 may reduce a reflectance of an external light incident thereon from above the cover window 300. The second adhesive member 502 may be disposed between the polarizing member 200 and the display panel 100, and may be optically transparent. For example, the second adhesive member 502 may be, but not limited to, an optically transparent adhesive or an optically transparent resin.

The present disclosure is not limited to the above description. For example, in an embodiment of the present disclosure, the polarizing member 200 may be omitted. The polarizing member 200 may be integrated into the display panel 100. When the polarizing member 200 is omitted, the cover window 300 and the display panel 100 may directly be adhered to each other through a first adhesive member 501 in a state that the second adhesive member 502 is omitted. Hereinafter, a description will exemplarily be given based on that the polarizing member 200 is provided.

The cover window 300 may be disposed above the polarizing member 200. The cover window 300 may be disposed above the display panel 100 to protect the display panel 100, and may transmit light emitted from the display panel 100. The cover window 300 may be made of a transparent insulating material, and may include a rigid material such as, for example, glass or quartz. In an embodiment of the present disclosure, the cover window 300 may include plastic. For example, the cover window 300 may be a transparent polyimide film.

The cover window 300 may be disposed to overlap the display panel 100 and cover an entire surface of the display panel 100. Accordingly, the cover window 300 may function to protect the surface of the display panel 100, in which the surface is oriented toward the polarizing member 200 and the cover window 300, and may indicate a display surface on which an image is displayed. The cover window 300 generally has a shape similar to that of the display panel 100 on the plane, but its size may be greater than that of the display panel 100. For example, at both short sides of the display device 1, the cover window 300 may be protruded more outwardly than the display panel 100. At even both long sides of the display device 1, the cover window 300 may be protruded from the display panel 100. The length of the cover window 300 more protruded than the display panel 100 on the plane may be different in the case of both long sides and the case of the both short sides. However, the present disclosure is not limited thereto. For example, in an embodiment of the present disclosure, the length of the cover window 300 more outwardly protruded than the display panel 100 may be equal in the case of both long sides and the case of the both short sides. A plane shape of the cover window 300 may be the same as that of the display device 1. For example, the plane shape of the cover window 300 may be a rectangular shape that includes both long sides and both short sides.

The display device 1 may further include an adhesive member 500. In detail, the display device 1 may further include a first adhesive member 501 disposed between the polarizing member 200 and the cover window 300, a second adhesive member 502 disposed between the display panel 100 and the polarizing member 200, and a third adhesive member 503 disposed between the display panel 100 and the lower cover panel 400. For example, the adhesive member 500 may include the first adhesive member 501, the second adhesive member 502 and the third adhesive member 503.

The first adhesive member 501 may be disposed between the cover window 300 and the polarizing member 200, and may serve to mutually adhere the polarizing member 200 with the cover window 300. The first adhesive member 501 may be optically transparent. For example, the first adhesive member 501 may be, but not limited to, an optically transparent adhesive, or an optically transparent resin. In general, the optically transparent adhesive, or the optically transparent resin may have optical clarity and may provide shock resistance. Also, the first adhesive member 501 may include, but is not limited to, a material the same as that of the second adhesive member 502.

The first adhesive member 501 may cover a portion of an inner side and the other surface of a printing pattern 600. The first adhesive member 501 may directly adjoin a portion of the inner side and the other surface of the printing pattern 600.

The display device 1 may be formed by performing an autoclave process after the polarizing member 200 is adhered to the cover window 300 by the first adhesive member 501. For example, the cover window 300 may be adhered onto the polarizing member 200 through an adhesive process. In other words, the first adhesive member 501 of the display device 1 according to an embodiment of the present disclosure may be formed through the adhesive and autoclave processes. Bubbles (see 'BB' of FIG. 5) existing prior to the autoclave process may be generated again when the display device returns to the condition of a room temperature and a normal pressure after the autoclave process ends. When the bubbles BB remain in the display device 1, the bubbles may act as a factor that deteriorates quality of the display device 1 of a user. Thus, to prevent the quality of the display device 1 from being deteriorated, the first adhesive member 501 may be made of components and composition that may prevent the bubbles BB from being generated after the autoclave process.

The lower cover panel 400 may be disposed below the display panel 100. In detail, the lower cover panel 400 may be disposed on the other surface of the display panel 100, and may be attached to a rear surface of the display area DA of the display panel 100. The lower cover panel 400 includes at least one functional layer. The functional layer may be a layer that performs, for example, a heat emission function, an electromagnetic wave shielding function, a grounding function, a buffering function, a strength reinforcing function, a support function and/or a digitizing function. The functional layer may be a sheet layer made of sheet, a film layer made of film, a thin film layer, a coating layer, a panel, a plate, or the like. One functional layer may be made of a single layer, but may be made of a plurality of thin films or coating layers that are deposited. The functional layer may be, for example, a support member, a heat emission layer, an electromagnetic wave shielding layer, an impact absorption layer, a digitizer, or the like.

The lower cover panel 400 may be attached onto the other surface of the display panel 100 through the third adhesive member 503. The third adhesive member 503 may be disposed between the lower cover panel 400 and the display panel 100, and may be a pressure sensitive adhesive (PSA). Alternatively, the third adhesive member 503 may include a heat curable resin and/or a photocurable resin.

The display device 1 according to an embodiment of the present disclosure may further include a printing pattern 600 disposed on one surface oriented toward the display panel 100 from the cover window 300. The printing pattern 600 may be disposed in the non-display area NDA of the display device 1. The printing pattern 600 may be extended from an end portion of the cover window 300 and disposed to partially overlap the display panel 100.

The printing pattern 600 may include one surface that is in contact with one surface of the cover window 300, the other surface that is a surface oriented toward an opposite surface of the one surface of the printing pattern 600, and sides. The sides of the printing pattern 600 may include an outer side and an inner side. The outer side of the printing pattern 600 may be aligned with an outer side of the cover window 300, and the inner side of the printing pattern 600 may be aligned at a boundary between the non-display area NDA and the display area DA.

Hereinafter, the first adhesive member 501 will be described in detail. The following description will be based on the first adhesive member 501, but may be applied to the second adhesive member 502 and the third adhesive member 503.

The first adhesive member 501 includes an adhesive polymer resin. The adhesive polymer resin is made by polymerization and/or cross-linkage of a monomer constituting the first adhesive member 501 and a photoinitiator. Also, a monomer and a photoinitiator, which are not reacted with each other, may remain in the adhesive polymer resin by being dispersed therein. For example, the monomers included in the first adhesive member 501 may be polymerized and/or crosslinked to form the adhesive polymer resin, with the reaction catalyzed by free radicals generated by the photoinitiator through a photo process and/or a heat curing process.

The first adhesive member 501 according to an embodiment of the present disclosure may include an acrylic monomer and a urethane monomer. In addition, the first adhesive member 501 may further include a photoinitiator.

The first adhesive member 501 according to an embodiment of the present disclosure may include at least one of 2-ethylhexyl acrylate (2-EHA) expressed by the following Chemical formula 1, 2-hydroxyethyl acrylate (2-HEA) expressed by the following Chemical formula 2, methyl methacrylate expressed by the following Chemical formula 3, octyl methacrylate expressed by the following Chemical formula 4, isobornyl methacrylate expressed by the following Chemical formula 5, or methyl acrylate expressed by the following Chemical formula 6, as an acrylic monomer.

[Chemical formula 1]

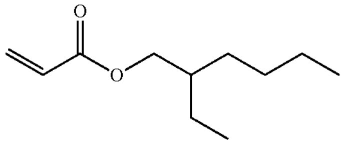

[Chemical formula 2]

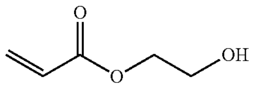

[Chemical formula 3]

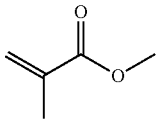

[Chemical formula 4]

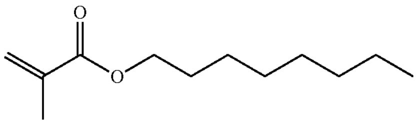

[Chemical formula 5]

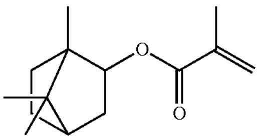

[Chemical formula 6]

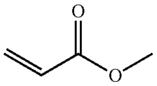

In detail, the first adhesive member 501 according to an embodiment of the present disclosure may include 2-ethylhexyl acrylate (2-EHA) of about 45 wt % or more and about 55 wt % or less expressed by Chemical formula 1, 2-hydroxyethyl acrylate (2-HEA) of about 20 wt % or more and about 30 wt % or less expressed by Chemical formula 2, methyl methacrylate exceeding 0 wt % and including about 5 wt % or more, expressed by Chemical formula 3, and octyl methacrylate of about 10 wt % or more and about 20 wt % or less expressed by Chemical formula 4, with respect to a total weight. The term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the first adhesive member 501, the acrylic monomer has a content range of about 75 wt % or more and about 95 wt % or less with respect to a total weight. When the content of the acrylic monomer is about 75 wt % or more and about 95 wt % or less, hardening of the first adhesive member 501 may actively be performed by exposure. When the content of the acrylic monomer is about 95 wt % or less and about 75 wt % or more, excellent strength of the first adhesive member 501 may be obtained. For example, with large portion of the first adhesive member 501 being polymerizable and/or cross-linkable, the adhesive polymer resin formed may have excellent strength.

In addition to the acrylic monomer, the first adhesive member 501 according to an embodiment of the present disclosure may further include 2,6-diisopropylphenyl isocyanate (2,6-DIPPI) of about 5 wt % or more and about 15 wt % or less expressed by the following Chemical formula 7 as a urethane monomer. The 2,6-diisopropylphenyl isocyanate (2,6-DIPPI) expressed by Chemical formula 7 may serve as a cross-linking agent. For example, with polymer chains being linked together extensively by covalent bonds, the polymer may be harder, and thus the first adhesive member 501 may have excellent strength.

[Chemical formula 7]

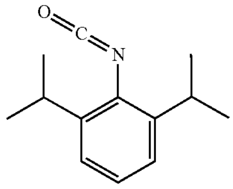

In the first adhesive member 501 according to an embodiment of the present disclosure, the 2,6-diisopropylphenyl isocyanate (2,6-DIPPI) expressed by Chemical formula 7 has a content range of about 5 wt % or more and about 15 wt % or less with respect to a total weight. When the content of the 2,6-diisopropylphenyl isocyanate (2,6-DIPPI) expressed by Chemical formula 7 is about 5 wt % or more and about 15 wt % or less, hardening of the first adhesive member 501 may actively be performed by exposure. When the content of the 2,6-diisopropylphenyl isocyanate (2,6-DIPPI) expressed by Chemical formula 7 is about 5 wt % or more with respect to the total weight of the first adhesive member 501, the first adhesive member 501 may have excellent elasticity at a high temperature, whereby permeable bubbles BB may be prevented from occurring. Also, when the content of the 2,6-diisopropylphenyl isocyanate (2,6-DIPPI) expressed by Chemical formula 7 is about 15 wt % or less with respect to the total weight of the first adhesive member 501, elasticity of the first adhesive member 501 may be prevented from being excessively increased at a high temperature, and bubbles BB may be prevented from occurring as excessive hardening is not performed. For example, in an embodiment of the present disclosure, the first adhesive member 501 may include a urethane monomer including 2,6-diisopropylphenyl isocyanate (2,6-DIPPI) of about 5 wt % or more and about 10 wt % or less with respect to a total weight of the first adhesive member 501.

The first adhesive member 501 according to an embodiment of the present disclosure may further include a benzophenone monomer as a photoinitiator. For example, the first adhesive member 501 may include at least one of 4-methylbenzophenone expressed by the following Chemical formula 8 or mesityl phenyl ketone expressed by the following Chemical formula 9. For example, in the photo exposure process, 4-methylbenzophenone or mesityl phenyl ketone may generate free radicals to catalyze the polymerization of the acrylic monomers. In an embodiment of the present disclosure, the photoinitiator 4-methylbenzophenone or mesityl phenyl ketone included in the first adhesive member 501 may have a content in a range from about 0 wt % to about 20 wt % with respect to a total weight, but the present disclosure is not limited thereto.

[Chemical formula 8]

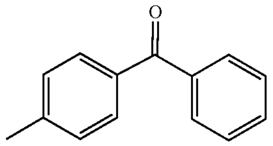

[Chemical formula 9]

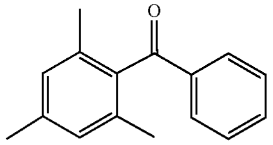

The first adhesive member 501 according to an embodiment of the present disclosure may indicate a maximum strain of 100% or less, 80% or less, 70% or less, or 50% or less when a creep test is carried out by a shearing stress of 2000 Pa for 600 seconds under the condition of 60° C. The creep test is a test that measures a maximum strain indicated when both ends of a sample SMP are held by a test device TD and then rotated by a shearing stress of 2000 Pa for 600 seconds. In this case, the maximum strain may indicate a rotation rate of the sample SMP. For example, a strain of 100% means rotation of one lap, and a strain of 200% means rotation of two laps. Regarding this, a detailed description will be given later with reference to FIGS. 7 and 8.

The first adhesive member 501 according to an embodiment of the present disclosure may indicate a shearing stress of about 2500 Pa to about 4500 Pa, about 3000 Pa to about 4000 Pa, about 3200 Pa to about 3800 Pa or about 3400 Pa to about 3600 Pa when a stress relaxation test is carried out based on a strain of 25% under the condition of 60° C. The stress relaxation test is a test that measures a shearing stress for indicating a strain of 25% by holding both sides of a sample SMP having a circular plate or a coin shape using a test device TD. Regarding this, a detailed description will be given later with reference to FIGS. 7 and 8.

The first adhesive member 501 according to an embodiment of the present disclosure may have adhesion of about 3400 gf/inch or more. To be described in Experimental example 5, the adhesion test is carried out between the cover window 300 and the polarizing member 200 using the first adhesive member 501 to obtain the adhesion of about 3400 gf/inch or more. When the polarizing member 200 is omitted, the cover window 300 and the display panel 100 may directly be adhered to each other through the first adhesive member 501. In this case, the adhesion between the first adhesive member 501 and the display panel 100 or adhesion between the first adhesive member 501 and the cover window 300 may be about 3400 gf/inch or more. The case that the first adhesive member 501 has adhesion of about 3400 gf/inch or more may have sufficient adhesion to mutually adhere the cover window 300 with the polarizing member 200 in a state that the first adhesive member 501 is disposed between the cover window 300 and the polarizing member 200.

Figure 4:
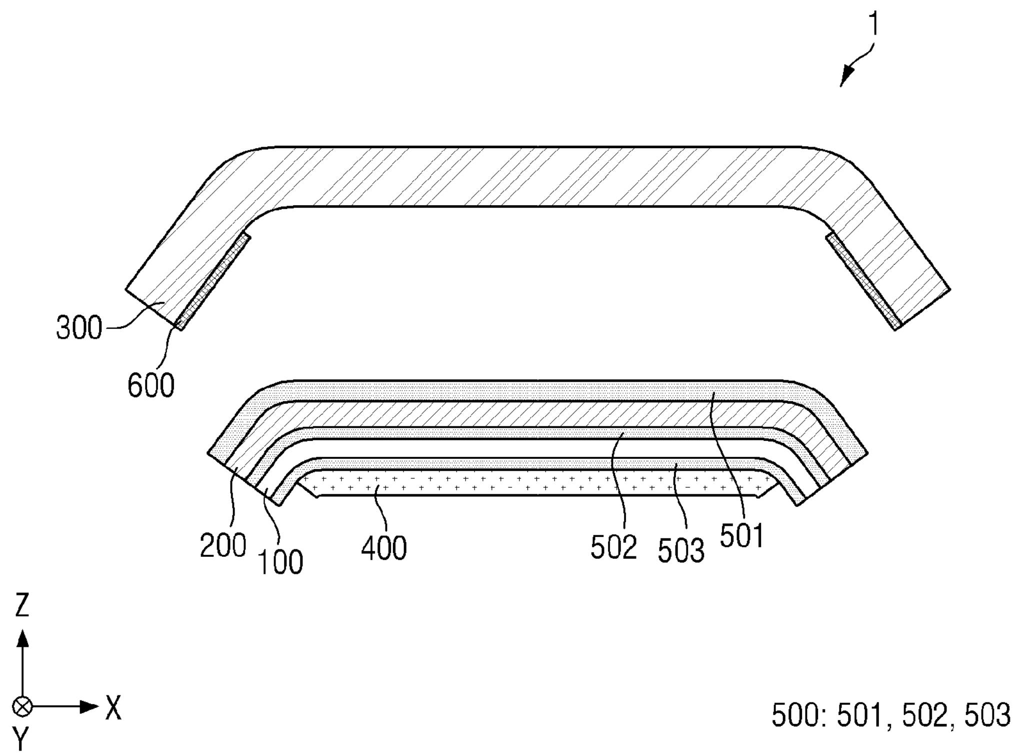
FIG. 4 is a schematic view illustrating an adhesive process of a cover window in a display device according to an embodiment of the present disclosure.
Figure 5:
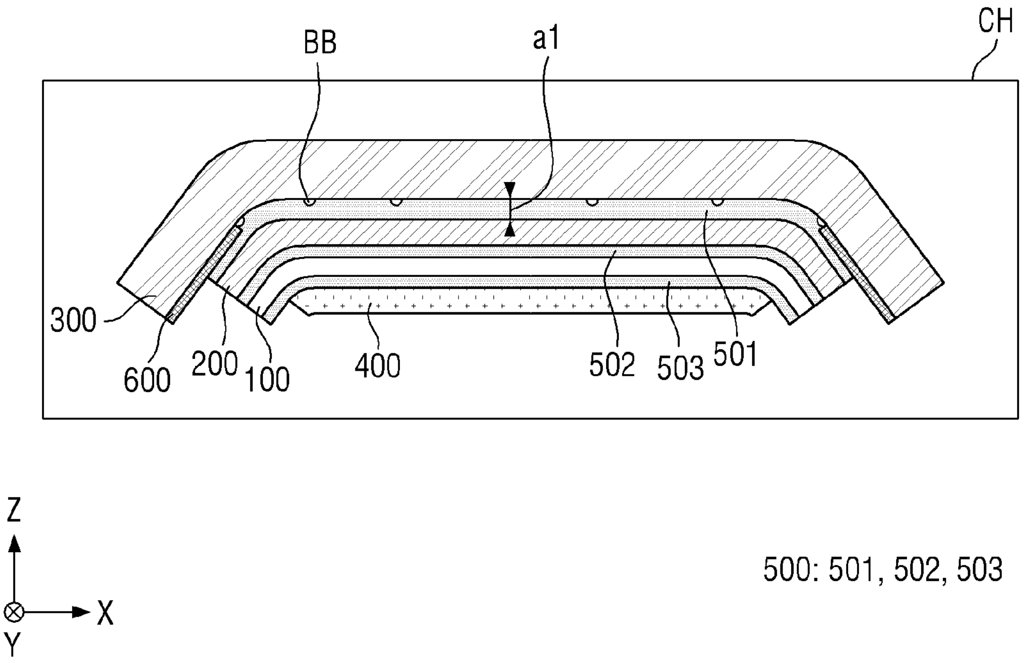
FIGS. 5 and 6 are cross-sectional views illustrating an autoclave process according to an embodiment of the present disclosure.
Figure 6:
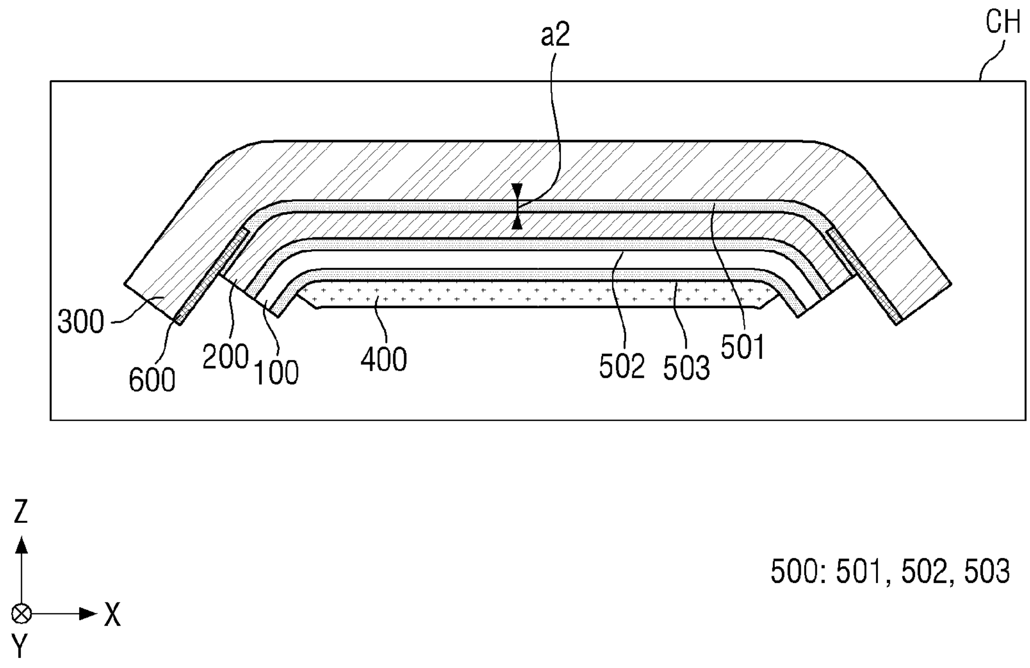

FIG. 4 is a schematic view illustrating an adhesive process of a cover window in a display device according to an embodiment of the present disclosure. FIGS. 5 and 6 are cross-sectional views illustrating an autoclave process according to an embodiment of the present disclosure. In detail, FIG. 5 illustrates that the display device 1 prior to the autoclave process is disposed inside an autoclave process chamber CH, and FIG. 6 illustrates that the display device 1 in the middle of the autoclave process is disposed inside the autoclave process chamber CH.

An adhesive process of the cover window 300 in the middle of a manufacturing process of the display device 1 will be described with reference to FIGS. 4 to 6.

The cover window 300 may be adhered onto the polarizing member 200 attached to the display panel 100. In detail, in a state that the polarizing member 200 is disposed on one surface of the display panel 100 and the lower cover panel 400 is disposed on the other surface of the display panel 100, the cover window 300 may be disposed on the polarizing member 200. In this case, the adhesive member 500, which includes the first adhesive member 501, the second adhesive member 502 and the third adhesive member 503, may respectively be disposed among the cover window 300, the polarizing member 200, the display panel 100 and the lower cover panel 400 to mutually adhere the respective elements with one another. In detail, the second adhesive member 502 may be interposed between the display panel 100 and the polarizing member 200 to mutually adhere the display panel 100 with the polarizing member 200, and the third adhesive member 503 may be interposed between the display panel 100 and the lower cover panel 400 to mutually adhere the display panel 100 with the lower cover panel 400.

The first adhesive member 501 may be disposed on one surface of the polarizing member 200 to which the cover window 300 is adhered. The first adhesive member 501 may fully be disposed on one surface of the polarizing member 200.

First of all, the cover window 300 may be attached onto the first adhesive member 501 which is attached on the polarizing member 200. When the cover window 300 is attached onto the first adhesive member 501, bubbles BB may be generated between the cover window 300 and the polarizing member 200 and then interposed therebetween. The bubbles BB may be generated by being trapped between the cover window 300 and the polarizing member 200 in the process of attaching the cover window 300 to the polarizing member 200. The cover window 300 may be made of a transparent material, whereby the bubbles BB may easily be visible. Also, since the cover window 300 may transmit light emitted from the display panel 100, the bubbles BB trapped between the cover window 300 and the polarizing member 200 may interfere the light emitted from the display panel 100. Although FIG. 5 shows that the bubbles BB are disposed between the cover window 300 and the first adhesive member 501, but the present disclosure is not limited thereto. For example, the bubbles BB may be interposed in the first adhesive member 501 and then surrounded by the first adhesive member 501 or disposed between the first adhesive member 501 and the polarizing member 200. The bubbles BB may be a factor that disturbs recognition of an image provided from the display panel 100. For example, the image quality of the display device 1 may be deteriorated due to the bubbles BB trapped between the cover window 300 and the polarizing member 200. Therefore, the bubbles BB may be removed through the autoclave process that will be described later.

The autoclave process may be a process of reinforcing adhesion between adhesive targets through performing a high temperature and a high pressure process and at the same time removing the bubbles BB. For example, although the autoclave process may be performed under the conditions of a temperature of 60° C. and an atmospheric pressure of 8 bar, without limitation to this example, the autoclave process may be performed under the condition of a higher temperature or a higher atmospheric pressure or the condition of a lower temperature or a lower atmospheric pressure. The autoclave process may be performed inside the chamber CH.

Referring to FIG. 5, in the display device 1 prior to the autoclave process, the first adhesive member 501 may have a first thickness a1. The first thickness a1 may mean an average thickness of the first adhesive member 501 prior to the autoclave process. Also, in the display device 1 prior to the autoclave process, bubbles BB may be disposed between the cover window 300 and the polarizing member 200.

Referring to FIG. 6, in the display device 1 in the middle of the autoclave process, the first adhesive member 501 may have a second thickness a2 thinner than the first thickness a1. The second thickness a2 may mean an average thickness of the first adhesive member 501 after the autoclave process.

The bubbles BB interposed between the cover window 300 and the polarizing member 200 prior to the autoclave process may be removed through the autoclave process. The bubbles BB may be melted in the first adhesive member 501 by a high pressure, or may be emitted to the outside and then removed. In this case, although the bubbles BB are removed may mean that the bubbles BB are completely removed, but the present disclosure is not limited thereto. For example, sizes of the bubbles BB may be reduced so as not to be visible to a user, or the bubbles BB may move to an area overlapped with the printing pattern 600 and then are not visible to a user.

After the autoclave process, the display device 1 may return to the condition of a room temperature and a normal pressure. At this time, solubility of the bubbles BB for the first adhesive member 501 may be reduced due to the pressure reduction from the high pressure to the normal pressure. Alternatively, the bubbles BB may be permeated into the edge portion of the first adhesive member 501 due to the pressure reduction to the normal pressure. Therefore, the removed bubbles BB may be regenerated and visible. However, in the display device 1 according to an embodiment of the present disclosure, even though the display device 1 returns to the room temperature and the normal pressure after the autoclave process, due to the components constituting the first adhesive member 501 and composition of the components, the bubbles BB may be neither regenerated nor visible. For example, the first adhesive member 501 according to an embodiment of the present disclosure may be made of components and composition that may prevent the bubbles BB from being regenerated after performing the autoclave process and returning to the room temperature and the normal pressure. For example, the first adhesive member 501 according to an embodiment of the present disclosure may include a component such as 2,6-diisopropylphenyl isocyanate (2,6-DIPPI) of about 5 wt % or more and about 10 wt % or less with respect to a total weight of the first adhesive member 501, so that the first adhesive member 501 may have excellent elasticity at a high temperature, whereby permeable bubbles BB may be prevented from occurring, and accordingly may not be regenerated after performing the autoclave process on the display device 1 and returning to the room temperature and the normal pressure.

Hereinafter, an adhesive composition of the first adhesive member 501 that allows the bubbles BB not to be visible in the display device 1 will be described in more detail through an experimental example based on a manufacturing example according to an embodiment of the present disclosure and comparative examples.

Manufacturing Example 1

An adhesive composition that includes 2-ethylhexyl acrylate (2-EHA) expressed by Chemical formula 1, 2-hydroxyethyl acrylate (2-HEA) expressed by Chemical formula 2, methyl methacrylate expressed by Chemical formula 3, isobornyl methacrylate expressed by Chemical formula 5, octyl methacrylate expressed by Chemical formula 4 and methyl acrylate expressed by Chemical formula 6 as acrylic monomers, includes 2,6-diisopropylphenyl isocyanate (2,6-DIPPI) expressed by Chemical formula 7 as a urethane monomer, and includes 4-methylbenzophenone expressed by Chemical formula 8 and mesityl phenyl ketone expressed by Chemical formula 9 as photoinitiators has been manufactured according an embodiment of the present disclosure.

The aforementioned components may be identified through Pyrolysis-Gas Chromatography-Mass Spectrometry (Py-GC-MS) analysis.

Contents of some of the aforementioned components may also be identified through Nuclear Magnetic Resonance spectroscopy (NMR). In the manufacturing example 1, 2-ethylhexyl acrylate (2-EHA) expressed by Chemical formula 1 may be 47.26 wt %, 2-hydroxyethyl acrylate (2-HEA) expressed by Chemical formula 2 may be 25.45 wt %, methyl methacrylate expressed by Chemical formula 3 may be 2.78 wt %, octyl methacrylate expressed by Chemical formula 4 may be 15.52 wt %, and 2,6-diisopropylphenyl isocyanate (2,6-DIPPI) expressed by Chemical formula 7 may be 8.89 wt %, with respect to the total weight of the adhesive composition.

Comparative Example 1

An adhesive composition that includes 2-ethylhexyl acrylate (2-EHA) expressed by Chemical formula 1, octyl methacrylate expressed by Chemical formula 4 and isobornyl acrylate expressed by the following Chemical formula 10 as acrylic monomers, and includes 4-hydroxybenzophenone expressed by the following Chemical formula 11 and irgacure 651 (2,2-Dimethoxy-1,2-diphenylethan-1-one) expressed by the following Chemical formula 12 as photoinitiators has been manufactured.

[Chemical formula 10]

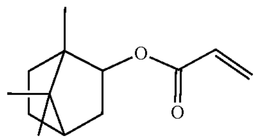

-continued

[Chemical formula 11]

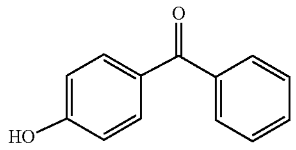

[Chemical formula 12]

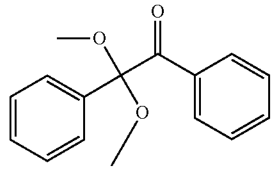

The aforementioned components may be identified through Pyrolysis-Gas Chromatography-Mass Spectrometry (Py-GC-MS) analysis.

Comparative Example 2

An adhesive composition that includes 2-ethylhexyl acrylate (2-EHA) expressed by Chemical formula 1, 2-hydroxyethyl acrylate (2-HEA) expressed by Chemical formula 2, octyl methacrylate expressed by Chemical formula 4 and 2-hydroxyethyl methacrylate expressed by the following Chemical formula 13 as acrylic monomers, and includes 4-hydroxybenzophenone expressed by Chemical formula 11, methyl 4-benzoylbenzonate expressed by the following Chemical formula 14 and irgacure 651 expressed by Chemical formula 12 as photoinitiators has been manufactured.

[Chemical formula 13]

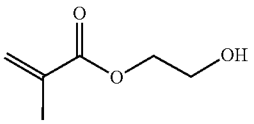

[Chemical formula 14]

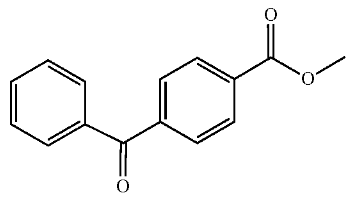

The aforementioned components may be identified through Pyrolysis-Gas Chromatography-Mass Spectrometry (Py-GC-MS) analysis.

Comparative Example 3

An adhesive composition that includes 2-ethylhexyl acrylate (2-EHA) expressed by Chemical formula 1, methyl methacrylate expressed by Chemical formula 3, octyl methacrylate expressed by Chemical formula 4, isobornyl methacrylate expressed by Chemical formula 5, methyl acrylate expressed by Chemical formula 6, lauryl acrylate expressed by the following Chemical formula 15, and pentaerythritol triacrylate by the following Chemical formula 16 and 2-ethylhexyl methacrylate expressed by the following Chemical formula 17 as acrylic monomers, and includes 4-methylbenzophenone expressed by Chemical formula 8 and mesityl phenyl ketone expressed by Chemical formula 9 as photoinitiators has been manufactured.

[Chemical formula 15]

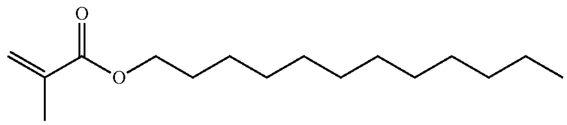

[Chemical formula 16]

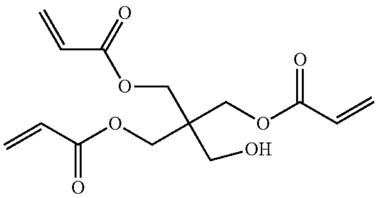

[Chemical formula 17]

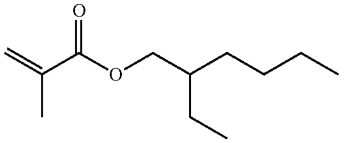

The aforementioned components may be identified through Pyrolysis-Gas Chromatography-Mass Spectrometry (Py-GC-MS) analysis.

Contents of some of the aforementioned components may also be identified through Nuclear Magnetic Resonance spectroscopy (NMR). Regarding the contents of some components in the comparative example 3, 2-ethylhexyl acrylate (2-EHA) expressed by Chemical formula 1 may be 20.58 wt %, 2-ethylhexyl methacrylate expressed by Chemical formula 17 may be 60.74 wt %, and methyl methacrylate expressed by Chemical formula 3 may be 16.09 wt %, with respect to the total weight of the adhesive composition.

Figure 7:
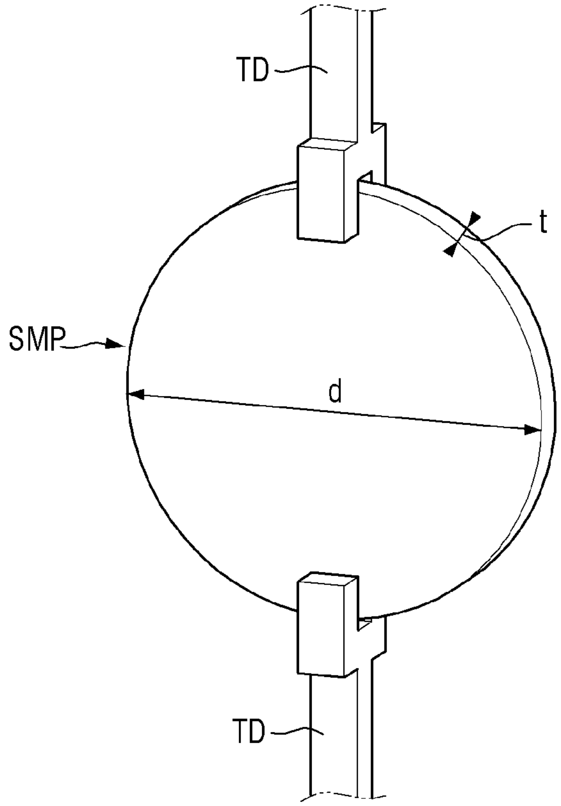
FIGS. 7 and 8 are schematic views illustrating creep test and stress relaxation test processes.
Figure 8:
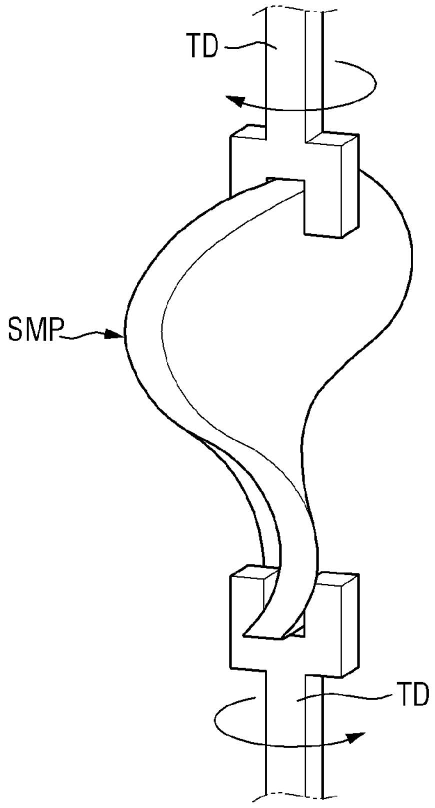
Figure 9:
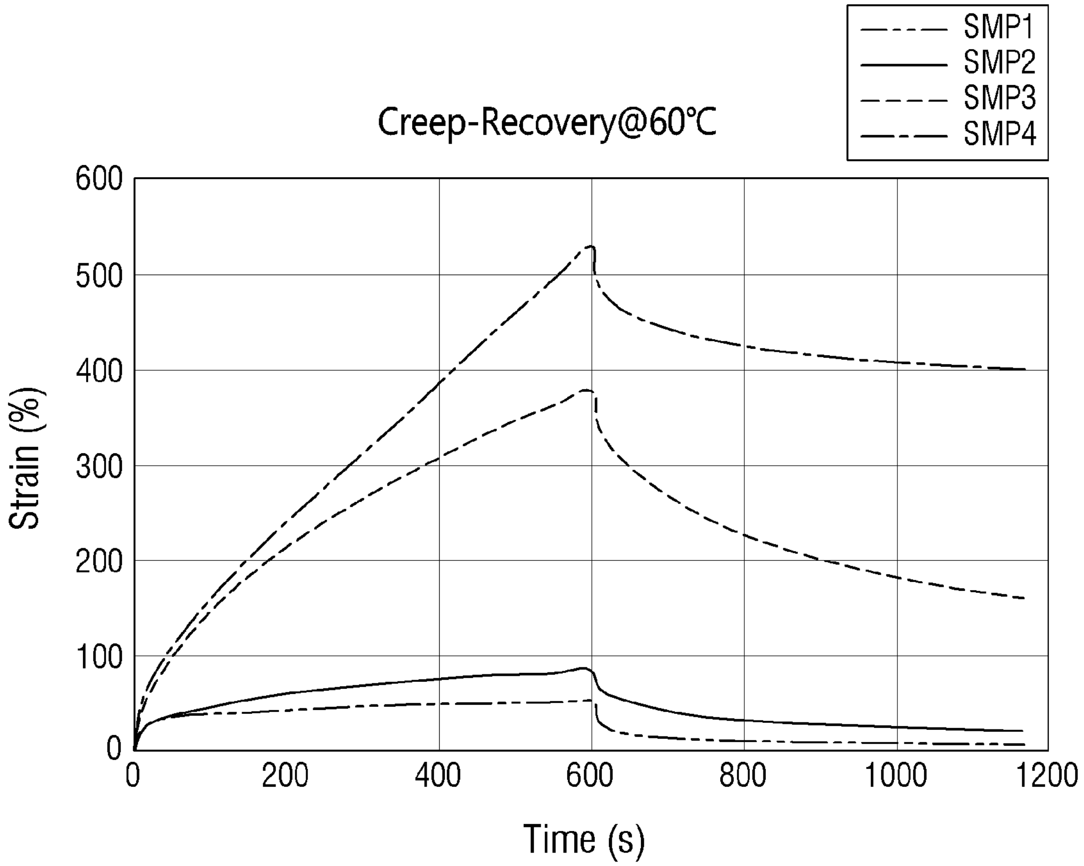
FIG. 9 is a graph illustrating a result of the creep test in FIGS. 7 and 8.
Figure 10:
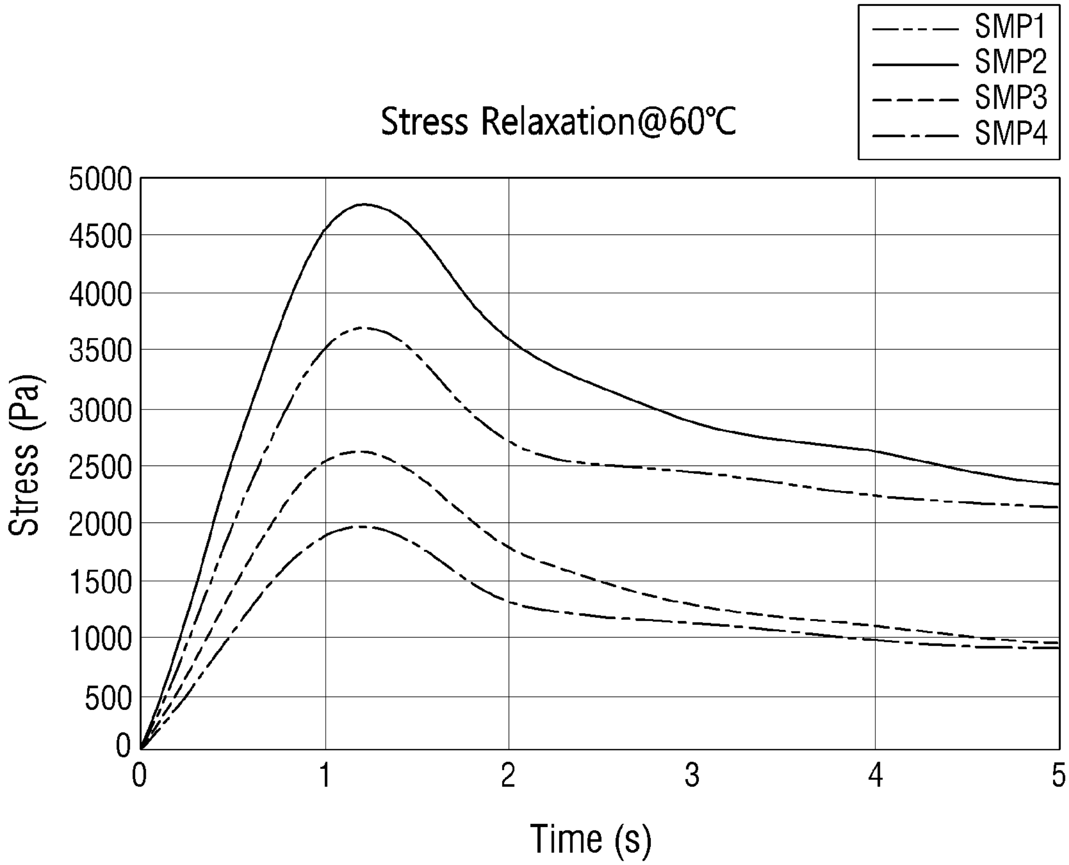
FIG. 10 is a graph illustrating a result of the stress relaxation test in FIGS. 7 and 8.

FIGS. 7 and 8 are schematic views illustrating creep test and stress relaxation test processes. FIG. 9 is a graph illustrating a result of the creep test in FIGS. 7 and 8. FIG. 10 is a graph illustrating a result of the stress relaxation test in FIGS. 7 and 8.

In the following description, each of the samples SMP has been manufactured in a circular plate or coin shape having a diameter 'd' of 8 mm on a base side and a thickness 't' of 600 μm. The first sample SMP1 is the sample SMP manufactured using the manufacturing example 1, the second sample SMP2 is the sample SMP manufactured using the comparative example 1, the third sample SMP3 is the sample SMP manufactured using the comparative example 2, and the fourth sample SMP4 is the sample SMP manufactured using the comparative example 3.

Experimental Example 1: Creep Test Carried Out at 60° C.

The creep test has been carried out using the first to fourth samples SMP1, SMP2, SMP3 and SMP4 by a shearing stress of 2000 Pa for 600 seconds under the condition of 60° C. FIG. 9 illustrates a strain indicated when the samples SMP, which include the first to fourth samples SMP1, SMP2, SMP3 and SMP4, respectively manufactured by the manufacturing example 1 and the comparative examples 1 to 3 are removed after a shearing stress of 2000 Pa is applied to the samples for 600 seconds, as a result of the experimental example 1. In this case, the strain may mean a rotation level of the sample SMP. For example, when the strain is 100% in this experiment, it means that the sample SMP is rotated for one lap, and when the strain is 200%, it means that the sample SMP is rotated for two laps.

Referring to FIG. 9, in the experimental example 1, each of the first and second samples SMP1 and SMP2 has indicated a maximum strain of about 100% or less at a point of 600 seconds. In detail, the first sample SMP1 has indicated a maximum strain of about 50% at a point of 600 seconds, and the second sample SMP2 has indicated a maximum strain of about 90% at a point of 600 seconds. Meanwhile, in the experimental example 1, the third sample SMP3 has indicated a maximum strain of about 350% to about 400% at a point of 600 seconds, and the fourth sample SMP4 has indicated a maximum strain of about 500% to about 550% at a point of 600 seconds.

As a result, when a shearing stress of 2000 Pa is applied to the first sample SMP1 manufactured by the manufacturing example 1 for 600 seconds, the first sample SMP1 manufactured by the manufacturing example 1 has indicated the maximum strain of the smallest amount among the first to fourth samples SMP1, SMP2, SMP3 and SMP4.

A low maximum strain may be indicated by the experimental example 1 to minimize occurrence of bubbles BB in the display device 1. In detail, when the low maximum strain is indicated by the experimental example 1, it may mean that cross-linking of the adhesive composition has been well performed, whereby hardening has been well performed. Thus, the first sample SMP1 manufactured using the manufacturing example 1 having the smallest maximum strain may have a higher capability of minimizing the occurrence of bubbles BB.

It is noted that the first sample SMP1 has been better hardened than the second to fourth samples SMP2, SMP3 and SMP4 under the condition of 60° C. That is, since the first sample SMP1 is better hardened than the second to fourth samples SMP2, SMP3 and SMP4 under the condition of 60° C., the first sample SMP1, which uses the manufacturing example 1 according to an embodiment of the present disclosure, may be applied to the first adhesive member 501 to reduce occurrence of bubbles BB.

Experimental Example 2: Stress Relaxation Test Carried Out at 60° C.

A stress relaxation test has been carried out using the first to fourth samples SMP1, SMP2, SMP3 and SMP4 under the condition of 60° C. The result of the experimental example 2 is shown in FIG. 10.

Referring to FIG. 10, in the experimental example 2, the first sample SMP1 has indicated a strain of 25% when a shearing stress of about 3000 Pa to about 4000 Pa is applied thereto at a point of about 1.2 seconds. The second sample SMP2 has indicated a strain of 25% when a shearing stress of about 4000 Pa to about 5000 Pa is applied thereto at a point of about 1.2 seconds. The third sample SMP3 has indicated a strain of 25% when a shearing stress of about 2000 Pa to about 3000 Pa is applied thereto at a point of about 1.2 seconds. The fourth sample SMP4 has indicated a strain of 25% when a shearing stress of about 1500 Pa to about 2500 Pa is applied thereto at a point of about 1.2 seconds.

A shearing stress of about 3000 Pa or more and about 4000 Pa or less may be indicated by the experimental example 2 as a suitable range of the shearing stress to minimize occurrence of bubbles BB in the display device 1. When a shearing stress of about 3000 Pa or more is indicated by the experimental example 2, a flow of the adhesive composition becomes weak, whereby overflow may be avoided, and when a shearing stress of about 4000 Pa or less is indicated by the experimental example 2, the adhesive composition may be prevented from being over-hardened, whereby high adhesion may be indicated.

In view of the aspect that overflow is prevented from occurring and sufficient adhesion is embodied, the first sample SMP1, which uses the manufacturing example 1 according to an embodiment of the present disclosure, indicating a shearing stress of about 3000 Pa or more and about 4000 Pa or less in the experimental example 2 may be applied to the first adhesive member 501 to reduce occurrence of bubbles BB.

Experimental Example 3: Test as to Occurrence of Bubbles after Autoclave Process The first adhesive member 501 described with reference to FIGS. 2 to 6 has been manufactured using each adhesive composition of the manufacturing example 1 and the comparative examples 1 to 3, the cover window 300 has been attached to the polarizing member 200 by the first adhesive member 501, and whether bubbles BB which are visible exist has been observed after the autoclave process.

As a result of observation through the experimental example 3, it is noted that bubbles BB are not visible when the first adhesive member 501 is manufactured using the manufacturing example 1, the comparative example 2 and the comparative example 3, however, bubbles BB are visible when the first adhesive member 501 is manufactured using the comparative example 1. Therefore, it is noted that to manufacture the first adhesive member 501, the manufacturing example 1, the comparative example 2 and the comparative example 3 may be used in view of the aspect that the bubbles BB are not visible through the experiment example 3.

Experimental Example 4: Overflow Test

The first adhesive member 501 described with reference to FIGS. 2 to 6 has been manufactured using each adhesive composition of the manufacturing example 1 and the comparative examples 1 to 3, the cover window 300 has been attached to the polarizing member 200 by the first adhesive member 501, and whether overflow of the first adhesive member 501 manufactured by each adhesive composition occurs has been observed after the autoclave process.

Since the first adhesive member 501 manufactured using the comparative example 2 has not been hardened sufficiently, overflow that allows the first adhesive member 501 to partially flow out has been observed. Meanwhile, the first adhesive member 501 manufactured using the manufacturing example 1 and the comparative examples 1 and 3 has been hardened sufficiently, whereby overflow has not been observed.

As a result of observation through the experimental example 4, the adhesive composition of the manufacturing example 1, the comparative example 1 and the comparative example 3 may be applied to the first adhesive member 501 in view of the aspect that overflow is prevented from occurring.

Experimental Example 5: Adhesion Test

The first adhesive member 501 described with reference to FIGS. 2 to 6 has been manufactured using each adhesive composition of the manufacturing example 1 and the comparative examples 1 to 3, the cover window 300 has been attached to the polarizing member 200 by the first adhesive member 501, and adhesion of the first adhesive member 501 manufactured by each adhesive composition has been tested after the autoclave process. In detail, adhesion between the cover window 300 and the polarizing member 200 has been tested using the first adhesive member 501.

The first adhesive member 501 manufactured using the comparative example 3 has indicated adhesion of about 800 gf/inch. This may be too low adhesion to be used when the cover window 300 is attached with the polarizing member 200. The first adhesive member 501 manufactured using the manufacturing example 1 and the comparative examples 1 and 2 has indicated adhesion of about 3400 gf/inch or more.

As a result of the adhesion test through the experimental example 5, the adhesive composition of the manufacturing example 1, the comparative example 1 and the comparative example 2 may be applied to the first adhesive member 501 in view of the aspect that sufficient adhesion is embodied.

In short, when the adhesive composition of the manufacturing example 1 is used as the first adhesive member 501 in the display device 1 according to an embodiment of the present disclosure, even though the display device 1 returns to the condition of a room temperature and a normal pressure after the autoclave process, bubbles BB may not be visible. Also, when the adhesive composition of the manufacturing example 1 is used as the first adhesive member 501, overflow that allows the first adhesive member 501 to flow out may be prevented from occurring in the display device 1, and adhesive targets may be stably adhered to each other by the first adhesive member 501 due to sufficient adhesion. In addition, when the adhesive composition of the manufacturing example 1 is used as the first adhesive member 501, the first adhesive member 501 is well hardened as revealed in the creep test and the stress relaxation test.

While embodiments of the present disclosure have been shown and described above, it will be apparent to those skilled in the art that modifications and variations could be made without departing from the spirit and scope of the present disclosure as defined by the appended claims.

What is claimed is:

1. A display device comprising:

a display panel;

a cover window disposed on the display panel; and a first adhesive member disposed between the display panel and the cover window, the first adhesive member reducing occurrence of bubbles between the display panel and the cover window after an autoclave process, wherein the first adhesive member consists of a urethane monomer and an acrylic monomer, the urethane monomer includes 2,6-diisopropylphenyl isocyanate (2,6-DIPPI) expressed by following Chemical Formula 1 of about 9 wt % with respect to a total weight of the first adhesive member, and the acrylic monomer, with respect to the total weight of the first adhesive member, includes:

2-ethylhexyl acrylate (2-EHA) of about 47 wt %;

methyl methacrylate of about 3 wt %;

octyl methacrylate of about 16 wt %; and 2-hydroxyethyl acrylate (2-HEA) of about 25 wt %,

[Chemical Formula 1]

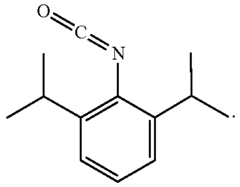

2. The display device of claim 1, wherein adhesion between the first adhesive member and the display panel or adhesion between the first adhesive member and the cover window is about 3400 gf/inch or more.

3. The display device of claim 1, wherein the first adhesive member is manufactured as a cylindrical shaped sample having a diameter of 8 mm and a height of 600 μm and indicates a maximum strain of about 100% or less during a creep test carried out for the cylindrical shaped sample by a shearing stress of 2000 Pa at 60° C. for 600 seconds.

4. The display device of claim 1, wherein the first adhesive member is manufactured as a cylindrical shaped sample having a diameter of 8 mm and a height of 600 μm and indicates a shearing stress of about 3000 Pa or more and about 4000 Pa or less during a stress relaxation test carried out for the cylindrical shaped sample with a strain of 25% at 60° C.

5. The display device of claim 1, wherein a planarization portion positioned on a plane and an edge portion positioned on at least one side of the planarization portion and bent from the planarization portion in a thickness direction are defined in the display device, and the display panel and the cover window are disposed over the planarization portion and the edge portion.

6. The display device of claim 5, wherein the edge portion is disposed to surround the planarization portion.

7. The display device of claim 5, further comprising a polarizing member disposed between the display panel and the cover window, wherein the first adhesive member is disposed between the cover window and the polarizing member.

8. The display device of claim 7, further comprising a second adhesive member disposed between the polarizing member and the display panel, wherein the second adhesive member is made of a material the same as that of the first adhesive member.

9. A display device comprising:

a display panel;

a cover window disposed on the display panel; and an adhesive member disposed between the display panel and the cover window, the adhesive member consisting of a urethane monomer and an acrylic monomer and the adhesive member reducing occurrence of bubbles between the display panel and the cover window after an autoclave process, wherein the urethane monomer includes 2,6-diisopropylphenyl isocyanate (2,6-DIPPI) expressed by following Chemical Formula 1 of about 9 wt % with respect to a total weight of the adhesive member, the acrylic monomer, with respect to the total weight of the adhesive member, includes 2-ethylhexyl acrylate (2-EHA) of about 47 wt %; methyl methacrylate of about 3 wt %; octyl methacrylate of about 16 wt %; and 2-hydroxyethyl acrylate (2-HEA) of about 25 wt %, the adhesive member is manufactured as a cylindrical shaped sample having a diameter of 8 mm and a height of 600 μm and indicates a maximum strain of about 100% or less during a creep test carried out for the cylindrical shaped sample by a shearing stress of 2000 Pa at 60° C. for 600 seconds, and the same cylindrical shaped sample indicates a shearing stress of about 3000 Pa or more and about 4000 Pa or less during a stress relaxation test carried out for the same cylindrical shaped sample with a strain of 25% at 60° C., to exhibit that the adhesive member is not over-hardened

[Chemical Formula 1]

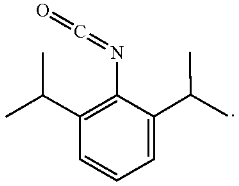

10. The display device of claim 9, wherein adhesion between the adhesive member and the display panel or adhesion between the adhesive member and the cover window is about 3400 gf/inch or more.

11. An adhesive member reducing occurrence of bubbles in a manufacturing process of a display device consisting of:

an acrylic monomer; and a urethane monomer, wherein the urethane monomer includes 2,6-diisopropylphenyl isocyanate (2,6-DIPPI) expressed by following Chemical Formula 1 of about 9 wt % with respect to a total weight, and the acrylic monomer, with respect to the total weight, includes:

2-ethylhexyl acrylate (2-EHA) of about 47 wt %;

methyl methacrylate exceeding of about 3 wt %;

octyl methacrylate of about 16 wt %; and 2-hydroxyethyl acrylate (2-HEA) of about 25 wt %,

[Chemical Formula 1]

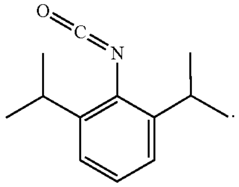

12. The adhesive member of claim 11, wherein the adhesive member is manufactured as a cylindrical shaped sample having a diameter of 8 mm and a height of 600 μm and indicates a maximum strain of about 100% or less during a creep test carried out for the cylindrical shaped sample by a shearing stress of 2000 Pa at 60° C. for 600 seconds.

13. The adhesive member of claim 11, wherein the adhesive member is manufactured as a cylindrical shaped sample having a diameter of 8 mm and a height of 600 μm and indicates a shearing stress of about 3000 Pa or more and about 4000 Pa or less during a stress relaxation test carried out for the cylindrical shaped sample with a strain of 25% at 60° C.

* * * * *